United States Patent [19]

Francovitch

[11] Patent Number: 4,674,244
[45] Date of Patent: Jun. 23, 1987

[54] ROOF CONSTRUCTION HAVING INSULATION STRUCTURE, MEMBRANE AND PHOTOVOLTAIC CELLS

[75] Inventor: Thomas F. Francovitch, Pasadena, Md.

[73] Assignee: Single-Ply Institute of America, Inc., Pasadena, Md.

[21] Appl. No.: 887,125

[22] Filed: Jul. 17, 1986

[51] Int. Cl.⁴ .......................................... H01L 31/04
[52] U.S. Cl. .................................... 52/173 R; 52/18; 136/246; 136/251
[58] Field of Search ............... 52/173 R, 18, 408, 410; 136/246, 251

[56] References Cited

U.S. PATENT DOCUMENTS

| | | | |
|---|---|---|---|
| 3,973,994 | 8/1976 | Redfield | 136/259 |
| 3,977,904 | 8/1976 | Köhler | 136/246 |
| 4,040,867 | 8/1977 | Forestieri et al. | 52/173 R X |
| 4,057,439 | 11/1977 | Lindmayer | 136/251 |
| 4,074,501 | 2/1978 | Sandqvist | 52/410 X |
| 4,097,308 | 6/1978 | Klein et al. | 136/251 |
| 4,162,595 | 7/1979 | Ramos et al. | 52/18 X |
| 4,162,597 | 7/1979 | Kelly | 52/410 |
| 4,235,643 | 11/1980 | Amick | 136/246 |
| 4,311,869 | 1/1982 | Kurth et al. | 136/251 X |
| 4,336,413 | 6/1982 | Tourneux | 52/173 R X |
| 4,373,308 | 2/1983 | Whittaker | 52/173 R |
| 4,383,130 | 5/1983 | Uroshevich | 136/261 |
| 4,389,826 | 6/1983 | Kelly | 52/410 |
| 4,401,710 | 8/1983 | Bansemir | 136/245 X |
| 4,419,530 | 12/1983 | Nath | 136/251 |
| 4,419,531 | 12/1983 | Lang et al. | 136/251 |

FOREIGN PATENT DOCUMENTS

| | | | |
|---|---|---|---|
| 2819901 | 11/1979 | Fed. Rep. of Germany | 52/18 |
| 2354430 | 1/1978 | France | 136/251 |
| 2411284 | 8/1979 | France | 52/18 |

Primary Examiner—Alfred C. Perham
Attorney, Agent, or Firm—Irvin A. Lavine

[57] ABSTRACT

A roof construction has a substantially flat, horizontal substrate, which may be of insulating material, having mounted thereon at least one structure having an inclined surface. A membrane of water-impervious material extends over the substrate and over the structure. The portion of the membrane covering the inclined surface of the structure has photocells thereon, the inclination and orientation of the inclined surface being selected for maximum radiation reception from the sun. The structure may be of generally triangular shape, is thermally insulating, and a plurality of parallel structures may be provided, with photocells on parallel, inclined surfaces. The structures may have additional surfaces which are opposite and facing the first mentioned surface of an adjacent structure, which additional surface or surfaces is provided with a reflective film for reflecting radiation into the photocells of the adjacent structure.

14 Claims, 3 Drawing Figures

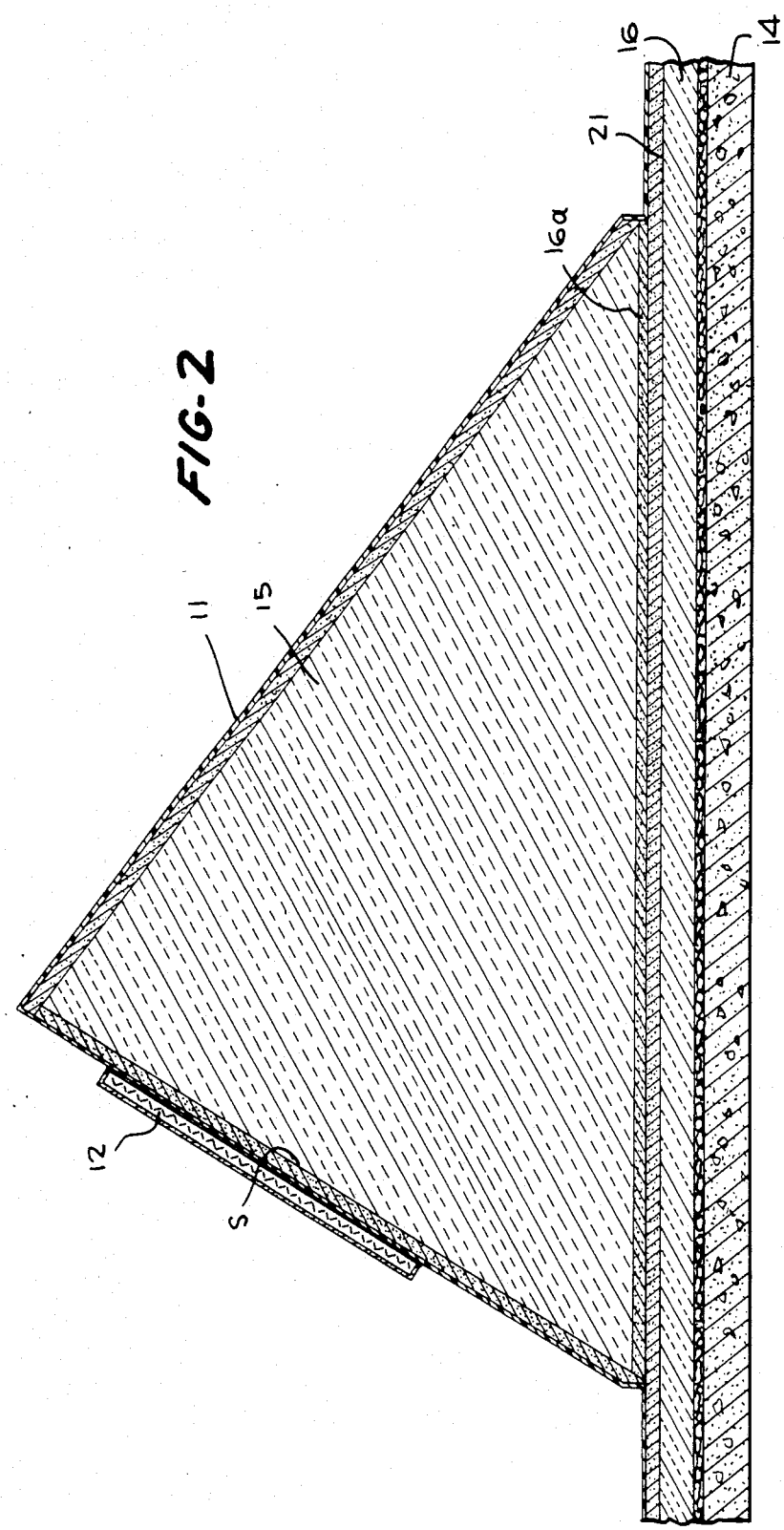

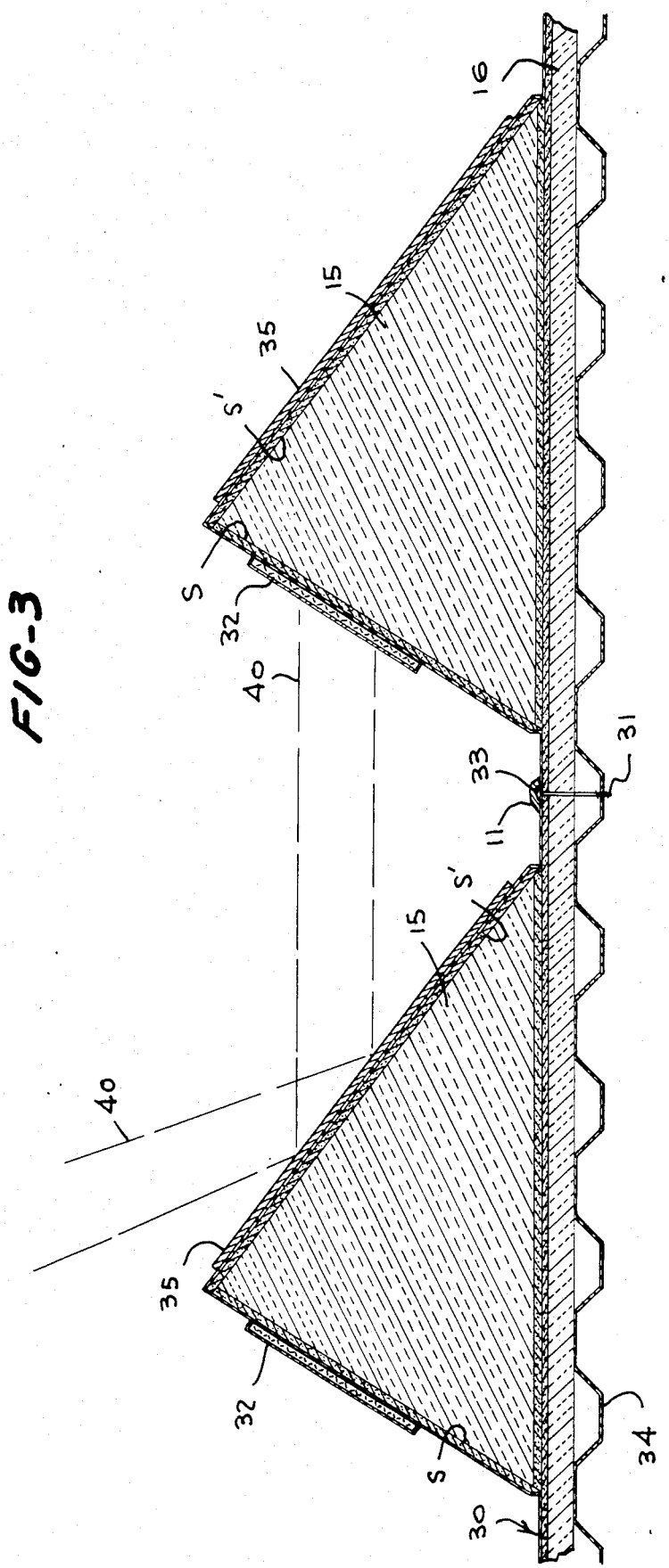

ROOF CONSTRUCTION HAVING INSULATION STRUCTURE, MEMBRANE AND PHOTOVOLTAIC CELLS

BACKGROUND OF THE INVENTION

The present invention relates to the construction of a roof, basically of the flat type, with a membrane covering, there being insulation structures extending above the flat roof, with inclined surfaces having photocells thereon.

It is now conventional to produce substantially flat roofs having a structural support which is surmounted by a substrate, the substrate being substantially flat and horizontal. The substrate may be of insulating material, or it may be wood, metal, gypsum, etc. The substrate is covered with a membrane of elastomeric material which is impervious to moisture, and is resistant to deterioration from solar radiation. Such roofs, which are generally designated as "single-ply" roofs, have gained wide acceptance, and have displaced, to a large extent, the previously used flat roof construction made up of layers of asphaltsoaked material.

Single-ply roof constructions are shown in Sandqvist U.S. Pat. No. 4,074,501, Kelly U.S. Pat. No. 4,162,597 and Kelly U.S. Pat. No. 4,389,826.

Solar cells have long been proposed for generating electricity from solar radiation. The solar cells themselves are typically made of a semi-conductor material such as shown in Kohler U.S. Pat. No. 3,977,904 and Redfield U.S. Pat. No. 3,973,994. Other types of photocells are known. The photo-cells are typically placed in an array, electrically interconnected, and are mounted on an electrically non-conductive support member. The support member for an array of solar cells may be in the form of a tray formed from such materials as epoxy fiberglass resin, or metal, as disclosed in Lindmayer U.S. Pat. No. 4,057,439. The array or panel of photocells is typically mounted in a metal frame, which provides suitable strength for the solar cell array or panel, the metal frame itself serving as the means for mounting the module at the proper angle: see Amick U.S. Pat. No. 4,235,643 and Kurth U.S. Pat. No. 4,311,869.

It is known, also, to mount such arrays of photocells, or so called solar panels, either on free standing supports placed on the ground, or on pre-existing roofs; the panel and frame are mounted on a stand anchored to the ground, or the panel including its supporting metal frame are secured onto a completely constructed roof, as by brackets and bolts. It has been estimated that as much as one-half of the costs of a photocell panel is due to the supporting frame.

Typically, solar cells are made of silicon, which is a brittle material, the individual solar cells being in the form of discs of between about two inches and four inches diameter: see Kurth et al. U.S. Pat. No. 4,311,869. An array of photocells is held in a panel by arranging the individual photocells in rows and columns: see Klein et al. U.S. Pat. No. 4,097,308. Kohler U.S. Pat. No. 3,977,904 discloses the formation of an array of photocells on a flexible support, made up of parallel and transversely extending lenses and notches, so that it may be coiled or rolled. Further, it is known to produce an amorphous solar cell by forming a continuous flexible ribbon of photocells, which is sliced into individual photocells: see Uroshevich U.S. Pat. No. 4,383,130.

The above-noted technology has not produced a roof construction which is relatively inexpensive, which will provide for inexpensive mounting of photocells on the membrane, and which in addition will provide for the positioning of the photocell at the most effective angle for receiving radiation.

SUMMARY OF THE INVENTION

The present invention is directed to a roof construction which includes a roof substrate which is substantially flat and horizontal, an insulation structure thereon having an inclined surface, an elastomeric membrane over the substrate and the structure, the membrane being applied to and supported by the substrate and structure, and supporting an array of photocells. The membrane has an array of photocell discs or strips placed directly on the portion of it which covers the inclined surface, and a transparent overlay covers the photocells. The photocells may be secured to the membrane, securing being preferably effected by a suitable adhesive. The structure supports the photocells in a position which provides maximum energy generation from the sun.

In an alternate embodiment, plural insulation structures are provided in parallel relationship, at least one having a first inclined surface with a photocell array on the membrane and a second inclined surface with a reflective film on the membrane, the second inclined surface and film being generally opposite an inclined surface of an adjacent structure on which is the membrane and photocells.

The roof construction may be installed by placement and attachment of the insulation structures to the substrate, attachment of the amorphous photocells to the membrane, and the placement of the membrane and photocells over the insulation structures and substrate and secured in place. Alternatively, the insulation structure with the membrane and amorphous photovoltaic cells fully assembled as a unit may be positioned on the substrate and structure and fastened.

The insulation structure is preferably a block or log of foamed plastic material, commonly used as in the form of sheets for thermal insulation, and is of generally triangular cross-section.

Among the objects of the present invention are to provide an economical roof and photocell construction, which will be effective as both a water and moisture impervious roof covering, and as a generator of electricity from solar radiation, without the expense of a separate frame or other similar support structure for the solar cell array. Another object is to provide a roof construction which will provide increased thermal insulation to the roof together with optimum position for the photocells.

BRIEF DESCRIPTION OF THE DRAWINGS

FIG. 2 is an enlarged cross-sectional view taken on the line A—A of FIG. 1.

FIG. 3 is a cross-sectional view of a second embodiment which includes a reflective film on the structure.

DESCRIPTION OF THE PREFERRED EMBODIMENTS

Figure 1:
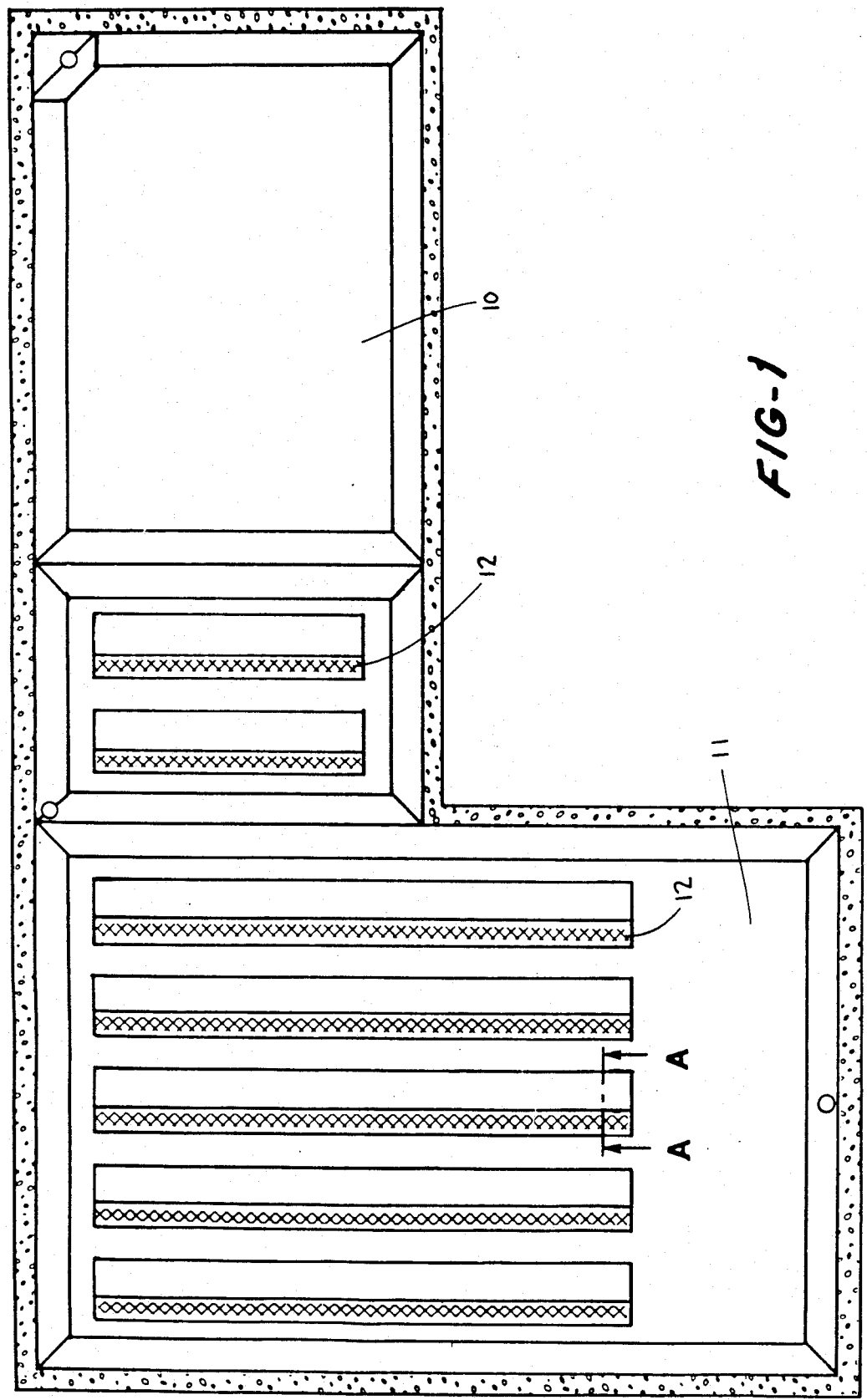
FIG. 1 is a plan view of a roof having a photocell array thereon.

Referring now to the drawings, wherein like or corresponding reference numerals are used to designate like or corresponding parts throughout the several views, there is shown in FIG. 1 a roof generally designated 10 and comprising a membrane 11. On the membrane 11 is an array of photocells 12 of known type, such as amorphous photocells, plural photocells being interconnected in known manner.

Referring now to FIG. 2, the roof construction 10 may be seen, including a structural support 14, shown schematically, and of conventional construction, on which is a substrate 16. Substrate 16 is shown as being a layer of insulating material, but may be any of the known kinds of roof substrate, including wood, metal, gypsum, or concrete. An insulation structure 15 provided on the substrate 16, and is held in place by a layer of adhesive 16a, or by mechanical fasteners. The insulation structure 15 serves as a support for a portion of the membrane 11. It may be constructed with a surface S angle needed at the optimum solar efficiency. This angle will vary dependant on the location of building of which roof 10 forms a part. Insulation structure 15 is preferably a block or log of foamed or cellular resin, of which polystyrene is a typical example. It is preferably triangular in transverse cross-section, and has a base of four feet and an altitude of two feet, in a typical example.

A plurality of photocells 12 is mounted on the portion of membrane 11 covering the surface S, being secured by adhesive. A transparent overlayer forms a part of the photocells 12. The adhesive may be in the form of a thermal setting sheet which underlies all of the photocells 12 and which may be a preformed film secured to the membrane 11, or the adhesive may be a paste or liquid applied to the photocells 12, or to membrane 11.

The membrane 11 is secured to the substrate 16 by suitable means, such as an adhesive layer 21 between the membrane 11 and portions or all of the substrate 16, or by mechanical means. Membrane 11 is a known, elastomeric material, having the properties of being water-impervious, resistant to ultraviolet light, and to deterioration from weather, including thermal stresses and moisture.

Referring now to FIG. 3, there is shown a roof construction 30 including a structural support 34, in the form of a configured sheet metal panel. On the structural support 34 is a substrate 16 of insulating material, on which is a membrane 11. A pair of parallel insulation structures 15 with inclined surfaces S and S1 are secured to substrate 16 and/or support 34. Membrane 11 covers the structures 15 and the substrate 16. A plurality of photocells 32 are secured on the upper surface of the portion of membrane 11 which covers surface S, by suitable adhesive. The photocells 32 are preferably in the form of elongate strips and are preferably of the amorphous/ovonic type. A linear fastener 31 penetrates the membrane 11, the substrate 16 and the structural support 34, to secure the membrane 11 in position as part of the construction of the roof 30. Linear fastener 31 is a headed, screw threaded fastener, although it will be understood that other types of linear fasteners may be used. A mass of mastic 33 is applied over the head of linear fastener 31 in order to prevent entry of water into the building of which the roof 30 forms a part, as by passing under the head and then along the shank of fastener 31.

A reflective film 35, preferably a separate, strip-like element of mylar, is adhered to a portion of membrane 11 covering surface S1, and is therefore opposite a photocell 32. This reflective film 35 will reflect solar radiation onto photocell 32, thereby increasing the energy output thereof.

There has been provided an improved roof construction which is economical to construct, being made of readily available and reasonably economical materials, which roof construction provides both superior insulating qualities, and a support for photocells at the optimum angle and position for receiving solar radiation and the generation of the maximum amount of electricity. A roof construction in accordance with the hereinabove disclosed invention is efficient and effective both as a covering to prevent entry of rain or moisture into the building of which the roof construction of the present invention forms a part, as well as providing for improved and enhanced electricity generation from solar radiation.

It will be obvious to those skilled in the art that various changes may be made without departing from the spirit of the invention, and therefore the invention is not limited to that shown in the drawings and described in the specification, but only as indicated in the appended claims.

I claim:

1. An improved roof construction for preventing entry of rain and melted snow into a building and for generating electricity comprising:
   a flat, substantially horizontal roof substrate,
   a structure extending above said substrate and having at least one inclined surface,
   a membrane of elastomeric material on and substantially covering said substrate and said structure, said membrane being water-impervious and resistant to ultraviolet light and deterioration from weather, and
   photocell means for converting photon energy to electricity on the portion of said membrane covering said inclined surface.

2. The improved roof construction of claim 1, wherein said structure is of thermally insulating material.

3. The improved roof construction of claim 1, said structure comprising a body of cellular resin material.

4. The improved roof construction of claim 3, said body being of substantially triangular cross-section.

5. The improved roof construction of claim 1, and a transparent film forming a part of said photo cell means.

6. The improved roof construction of claim 1, and further comprising at least one additional structure having an inclined surface substantially parallel to the first mentioned inclined surface, said membrane covering said additional structure, and photocell means on said portion of said membrane covering said second mentioned inclined surface.

7. The improved roof construction of claim 6, said structures being of thermally insulating material.

8. An improved roof construction comprising:
   (a) a substantially flat, horizontal roof substrate,
   (b) a plurality of structures extending above the substrate, each structure comprising an inclined surface, the inclined surfaces being in spaced, substantially parallel relation,
   (c) at least one said structure having a second inclined surface opposite and at an angle relative to the first inclined surface of an adjacent said structure,
   (d) a membrane of water impervious material covering said substrate and said structures,
   (e) photocells on the portion of said membrane covering said first mentioned inclined surfaces, and (f) means on said portion of said membrane covering said second inclined surface for reflecting solar radiation to photocells on said adjacent second inclined surface.

9. The improved roof construction of claim 8, said structures being of thermally insulating material.

10. The improved roof construction of claim 8, said structure comprising a body of cellular resin material.

11. The improved roof construction of claim 10, said body being of substantially triangular cross-section.

12. The improved roof construction of claim 8, said reflecting means comprising a film of reflective material.

13. The improved roof construction of claim 12, said film being mylar.

14. The improved roof construction of claim 8, and transparent film means forming a part of said photocells.

* * * * *